United States Patent
Souma (10) Patent No.: US 8,558,630 B2
(45) Date of Patent: Oct. 15, 2013

(54) OSCILLATOR CIRCUIT AND ELECTRONIC APPARATUS INCLUDING THE SAME

(75) Inventor: Hiroyuki Souma, Chiba (JP)

(73) Assignee: Seiko Instruments Inc., Chiba (JP)

( * ) Notice: Subject to any disclaimer, the term of this patent is extended or adjusted under 35 U.S.C. 154(b) by 1 day.

(21) Appl. No.: 13/398,330

(22) Filed: Feb. 16, 2012

(65) Prior Publication Data

US 2012/0223783 A1     Sep. 6, 2012

(30) Foreign Application Priority Data

Mar. 1, 2011 (JP) ................. 2011-044294

(51) Int. Cl.
*H03B 5/36* (2006.01)
(52) U.S. Cl.
USPC .......................................... 331/158; 331/182
(58) Field of Classification Search
USPC ............. 331/158, 160, 109, 182, 15, 116 R
See application file for complete search history.

(56) References Cited

U.S. PATENT DOCUMENTS 7,123,113 B1* 10/2006 Brennan et al. ............... 331/158
7,812,682 B2* 10/2010 Boroditsky et al. ........... 331/160

FOREIGN PATENT DOCUMENTS

JP     2008-205658     9/2008

* cited by examiner

*Primary Examiner* — Joseph Chang
(74) *Attorney, Agent, or Firm* — Brinks Hofer Gilson & Lione (57) ABSTRACT

An amplifier circuit for amplifying output signal from the crystal oscillator circuit is connected to the output side of the crystal oscillator circuit. The amplifier circuit amplifies the difference between the output voltage of the crystal oscillator circuit and the input voltage of a CMOS inverter of the crystal oscillator circuit. For example, a differential amplifier is connected to the output side of the crystal oscillator circuit, then the output voltage of the crystal oscillator circuit and the input voltage of the CMOS inverter are connected to the inputs of the differential amplifier.

5 Claims, 7 Drawing Sheets

OSCILLATOR CIRCUIT AND ELECTRONIC APPARATUS INCLUDING THE SAME

RELATED APPLICATIONS

This application claims priority under 35 U.S.C. §119 to Japanese Patent Application No. 2011-044294 filed on Mar. 1, 2011, the entire content of which is hereby incorporated by reference.

BACKGROUND OF THE INVENTION

1. Field of Invention

The present invention relates to a circuit for providing a crystal oscillator circuit with low power consumption, and particularly relates to an oscillator circuit including an amplifier circuit and an electronic apparatus including the oscillator circuit.

2. Description of the Related Art

For a portable apparatus, such as a watch or mobile phone, long time operation without charging and reduction in frequency of charging a built-in battery are desired. Accordingly, there is a growing demand for reducing drive power of an oscillator circuit including a piezoelectric device, such as a crystal resonator, used for the portable apparatus and significantly reducing power consumption of the oscillator circuit in standby mode (i.e., when the oscillator circuit is oscillating in unloaded condition).

Figure 3:
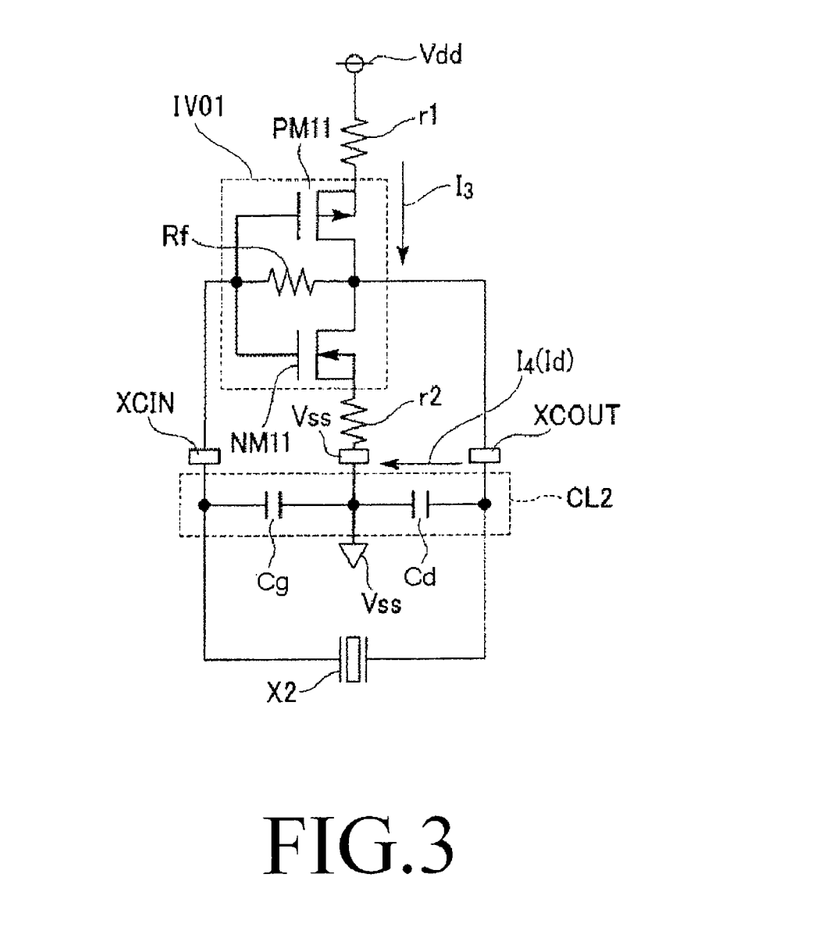
FIG. 3 shows an oscillator circuit including a crystal resonator.

FIG. 3 shows a typical oscillator circuit including a crystal resonator, including: a CMOS inverter IV01 as an inverting amplifier; a crystal resonator X2 connected between the input terminal XCIN and output terminal XCOUT of the CMOS inverter IV01; a capacitor providing a load capacitance Cg connected between the input terminal XCIN of the CMOS inverter IV01 and the power supply terminal Vss of a ground potential; and a capacitor providing a load capacitance Cd connected between the output terminal XCOUT of the CMOS inverter IV01 and the power supply terminal Vss of the ground potential.

The CMOS inverter IV01 includes a CMOS inverter consisting of a PMOS transistor PM11 and an NMOS transistor NM11 connected in series between a first power supply terminal and a second power supply terminal supplied with a power supply voltage Vdd and the ground potential, respectively, and a feedback resistor Rf. Drive current adjusting resistors r1 and r2 limit drive current for exciting the crystal resonator X2, the resistor r1 being connected between the source of the PMOS transistor PM11 of the CMOS inverter IV01 and the first power supply terminal, the resistor r2 being connected between the NMOS transistor NM11 of the CMOS inverter IV01 and the second power supply terminal.

In recent years, there is a demand for reducing power consumption of an oscillator circuit included in a portable apparatus or the like. In order to meet this demand, drive current of a crystal resonator of the oscillator circuit needs to be reduced. In order to do this, reducing the transconductance Gm of a CMOS inverter of the oscillator circuit may be appropriate. But, reducing the transconductance Gm may reduce the oscillation margin of the oscillator circuit.

The oscillation margin M of the oscillator circuit is given by the following equation (1):

$$M=\{|-Gm|/(\omega^2 Cg \cdot Cd)\}*(1/R1(\max))=RL/R1(\max) \qquad \text{Eq. (1)}$$

where $\omega$ is angular frequency of oscillation frequency, RL is negative resistance, R1(max) is the maximum value of the effective resistance R1 of the crystal resonator, and the oscillation margin M needs to be 5 or more.

Since the effective resistance R1 of the crystal resonator is to be determined in order to downsize the crystal resonator, the effective resistance R1 cannot be reduced too much. So, in order to maintain the oscillation margin M of the oscillator circuit while reducing the Gm, the load capacitances Cg and/or Cd of the capacitors providing the external load capacitance of the CMOS inverter should be reduced. So, in order to achieve this, the crystal resonator of the oscillator circuit needs to have a load capacitance CL meeting the requirement of reducing power consumption of a built-in IC, such as a microcomputer. In view of this, the applicant has already proposed the reduction of the load capacitance CL, or reduced CL (3-5 pF) with respect to the load capacitance CL of 12.5 pF for a conventional crystal resonator (JP-A-2008-205658).

However, reducing the load capacitance CL makes noticeable a problem of the capacitance tolerance of load capacitance CL and the frequency deviation Δf of oscillation frequency. For example, the oscillation frequency stability Δf (in ppm) when the load capacitance CL varies by ΔC (±5%) which is within a normal capacitance tolerance is 7.3 ppm with a load capacitance CL of 12.5 pF and ΔC of 1.25 pF; 13.2 ppm with a load capacitance CL of 6 pF and ΔC of 0.6 pF; and 20.5 ppm with a load capacitance CL of 3 pF and ΔC of 0.3 pF. This means that the load capacitance CL of 3 pF exhibits 2.8 times as much frequency deviation as the conventional load capacitance CL of 12.5 pF. So, in order to reduce the load capacitance CL (achieve reduced CL), the oscillation frequency stability with respect to the capacitance tolerance of the load capacitance CL needs to be improved.

Figure 4:
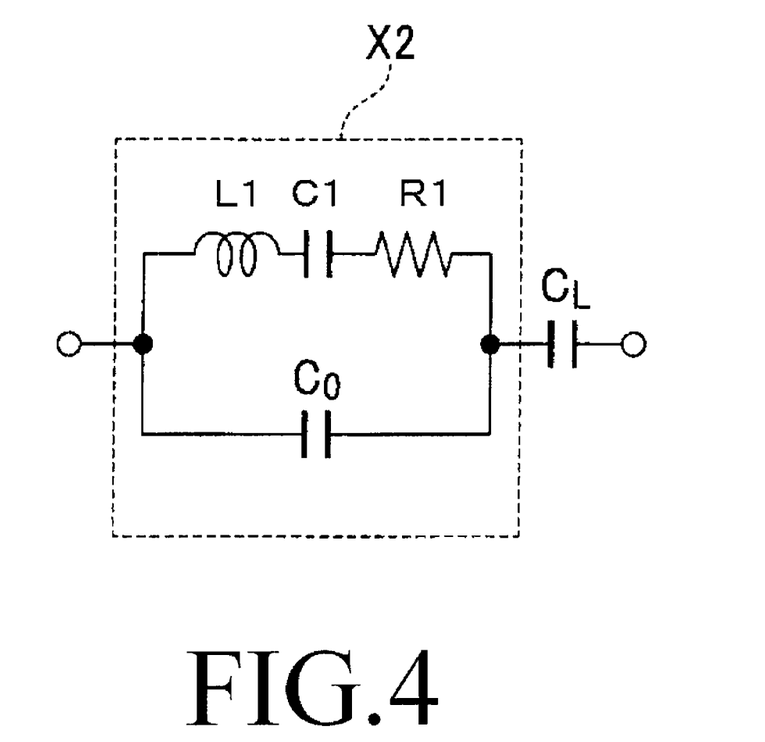
FIG. 4 shows an equivalent circuit of the circuit in FIG. 3 between the input/output terminals XCIN and XCOUT on the crystal resonator side.
Figure 5:
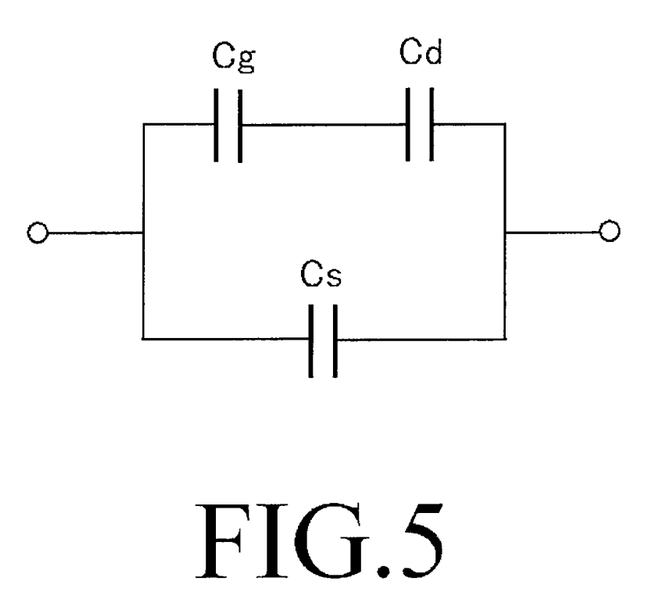
FIG. 5 shows capacitances included in the load capacitance CL.

FIG. 4 shows an equivalent circuit of the circuit in FIG. 3 between the input/output terminals XCIN and XCOUT on the crystal resonator side. The crystal resonator X2 and the load capacitance CL are connected in series. The crystal resonator is expressed as a circuit in which a serial resonance circuit of an inductance L1, a capacitance C1 and a resistance R1 that equivalently represents a mechanical resonance due to a piezoelectric effect and an inter-electrode capacitance C0 are connected in parallel. Also, various stray capacitances due to a CMOS semiconductor substrate, signal wires and the like exist between the input/output terminals XCIN and XCOUT. Denoting a combined stray capacitance of these stray capacitances by Cs, the load capacitance CL is a parallel connection of the stray capacitance Cs and the external capacitances Cg and Cd connected in series as shown in FIG. 5.

Accordingly, $$CL=Cs+Cg*Cd/(Cg+Cd) \qquad \text{Eq. (2)}.$$

Selecting external capacitors Cg and Cd matching with the oscillation frequency so that the CL will be 2-6 pF that meets the relation of (2) can improve the oscillation frequency stability. Specifically, since the load capacitance CL is the sum of the stray capacitance Cs and the external capacitance Cext {=Cg*Cd/(Cg+Cd)}, selecting the value of the external capacitance Cext to be corresponding to the difference between the load capacitance CL and the stray capacitance Cs may satisfy the equation (2), meaning that the load capacitance CL of the crystal resonator may match with the load capacitance on the oscillator circuit side with respect to the crystal resonator.

Figure 6:
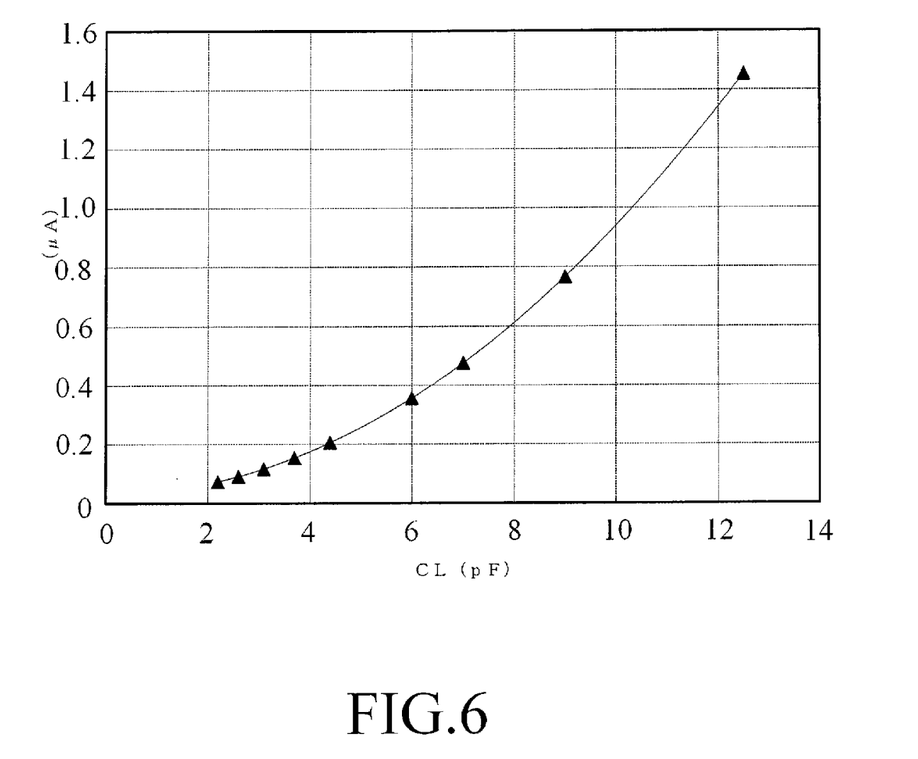
FIG. 6 shows a relation between the drive current and load capacitance CL of the crystal oscillator circuit.

FIG. 6 shows a relation between the drive current and load capacitance CL of the crystal oscillator circuit. As seen from FIG. 6, the drive current significantly decreases as the load capacitance CL decreases. For example, with a conventionally employed load capacitance of 12.5 pF, the drive current is about 1.5 μA, whereas, with a load capacitance of 2.2 PF, the drive current is 0.073 μA, reduced to about 5%. Thus, reducing the load capacitance CL contributes to reduced power consumption of the crystal oscillator circuit, and furthermore contributes to reduced power consumption of an electronic apparatus including the crystal oscillator circuit.

Figure 7:
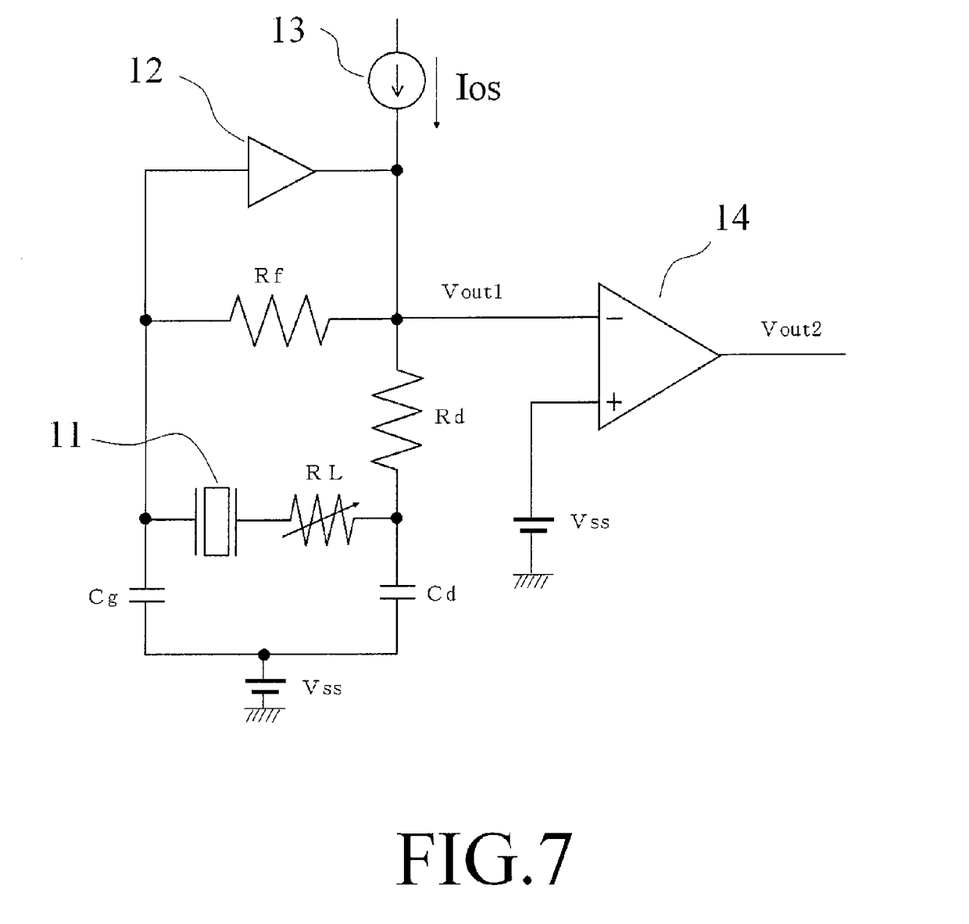
FIG. 7 shows an example of using a comparator as a circuit connected to the output side of the crystal oscillator circuit.

When the drive current of the crystal oscillator circuit is less than 0.1 μA (100 nA), the output voltage (Vout) is less than 10% of the supply voltage (Vpp) (i.e., Vout<0.1 Vpp), and since the supply voltage is about 1-3 V, the output voltage (Vout) is less than 0.1-0.3 V. FIG. 7 shows an example of using a comparator as a circuit connected to the output side of the crystal oscillator circuit. The circuit on the crystal oscillator circuit side shown in FIG. 7 is essentially similar to the circuit in FIG. 3, including a crystal resonator 11, a CMOS inverter 12 and a constant current source 13. The output Vout1 of the crystal oscillator circuit is analog signal (near-sinusoidal wave signal), which is converted into digital signal (rectangular wave signal) output Vout2 through a comparator 14. When the output Vout1 of the crystal oscillator circuit is more than 0.1-0.3 V, the comparator 14 operates properly, providing comparator output at a frequency (f0) corresponding to the output frequency (f0) of the crystal oscillator circuit. However, when the output Vout1 is less than about 0.1 V, the difference between two input voltages of the comparator may be too small to generate proper comparator output Vout2 (clock signal). This means that since the output of the crystal oscillator circuit has too low amplitude, the circuit connected to the crystal oscillator circuit cannot perform accurate information transmission for the output signal of the crystal oscillator circuit. Particularly, when the load capacitance CL is further reduced so that the drive current of the crystal oscillator circuit is about 50 nA, the output Vout1 of the crystal oscillator circuit exhibits further lower amplitude waveform of about 0.05 Vpp, which prevents the comparator 14 from outputting any output clock signal Vout2.

In view of the above, it is an object of the present invention to provide a circuit that provides output signal so that various next-stage circuits connected to the output side of a crystal oscillator circuit operate properly even when the drive current of the crystal oscillator circuit significantly decreases to less than 100 nA to cause the output voltage of the crystal oscillator circuit to be reduced to less than about 0.1 Vpp. That is, the invention relates to an oscillator circuit including an amplifier circuit and an electronic apparatus including the oscillator circuit.

SUMMARY OF THE INVENTION

In order to achieve the above object, according to the invention, a differential amplifier is connected to the output side of the crystal oscillator circuit, then the output voltage of the crystal oscillator circuit and the input voltage of a CMOS inverter of the crystal oscillator circuit are connected to the inputs of the differential amplifier. Or an instrumentation amplifier including three operational amplifiers is connected to the output side of the crystal oscillator circuit, to amplify the difference between the output voltage signal of the crystal oscillator circuit and the input voltage signal of the COS inverter of the crystal oscillator circuit.

When the amplifier circuit, such as the differential amplifier circuit and the instrumentation amplifier, is connected to the output side of the crystal oscillator circuit, the difference between the output voltage V2 of the crystal oscillator circuit and the input voltage V1 of the CMOS inverter of the crystal oscillator circuit can be amplified. That is, the output voltage V0 of the amplifier circuit is given by $V0=\alpha(V1-V2)$, $\alpha \geq 1$. Since $V2 \approx -V1$, $V0 \approx 2\alpha V1$ holds, meaning that the output voltage V0 of the amplifier circuit can be twice or more as large as the output voltage V2 of the crystal oscillator circuit. Thus, even when the drive current of the crystal oscillator circuit significantly decreases to less than 100 nA to cause the output voltage of the crystal oscillator circuit to be reduced to less than about 0.1 Vpp, the amplifier circuit can provide output large enough to allow proper rectangular wave signal to be generated from a comparator or the like connected to the next stage of the amplifier circuit. Furthermore, the gain of the amplifier circuit can be increased by adjusting the ratio of resistors included in the amplifier circuit. So, even when the output voltage of the crystal oscillator circuit further decreases, proper rectangular wave can be generated depending on the output of the crystal oscillator circuit, using a comparator or the like.

DETAILED DESCRIPTION OF THE PREFERRED EMBODIMENTS

It is an object of the present invention to provide a circuit that provides output signal so that various next-stage circuits connected to the output side of a crystal oscillator circuit operate properly even when the drive current of the crystal oscillator circuit significantly decreases to less than 100 nA to cause the output voltage of the crystal oscillator circuit to be reduced to less than about 0.1 Vpp. Specifically, an amplifier circuit for amplifying output signal from the crystal oscillator circuit is connected to the output side of the crystal oscillator circuit. The amplifier circuit amplifies the difference between the output voltage of the crystal oscillator circuit and the input voltage of a CMOS inverter of the crystal oscillator circuit. More specifically, the amplifier circuit connected to the output side of the crystal oscillator circuit detects the difference between the input voltage of the CMOS inverter of the crystal oscillator circuit (denoted by V2) and the output voltage of the crystal oscillator circuit (denoted by V1), then provides the output voltage V3 given by $V3=\alpha(V1-V2)$, $\alpha \geq 1$. Examples of such an amplifier circuit include a differential amplifier circuit and an instrumentation amplifier circuit.

Figure 1:
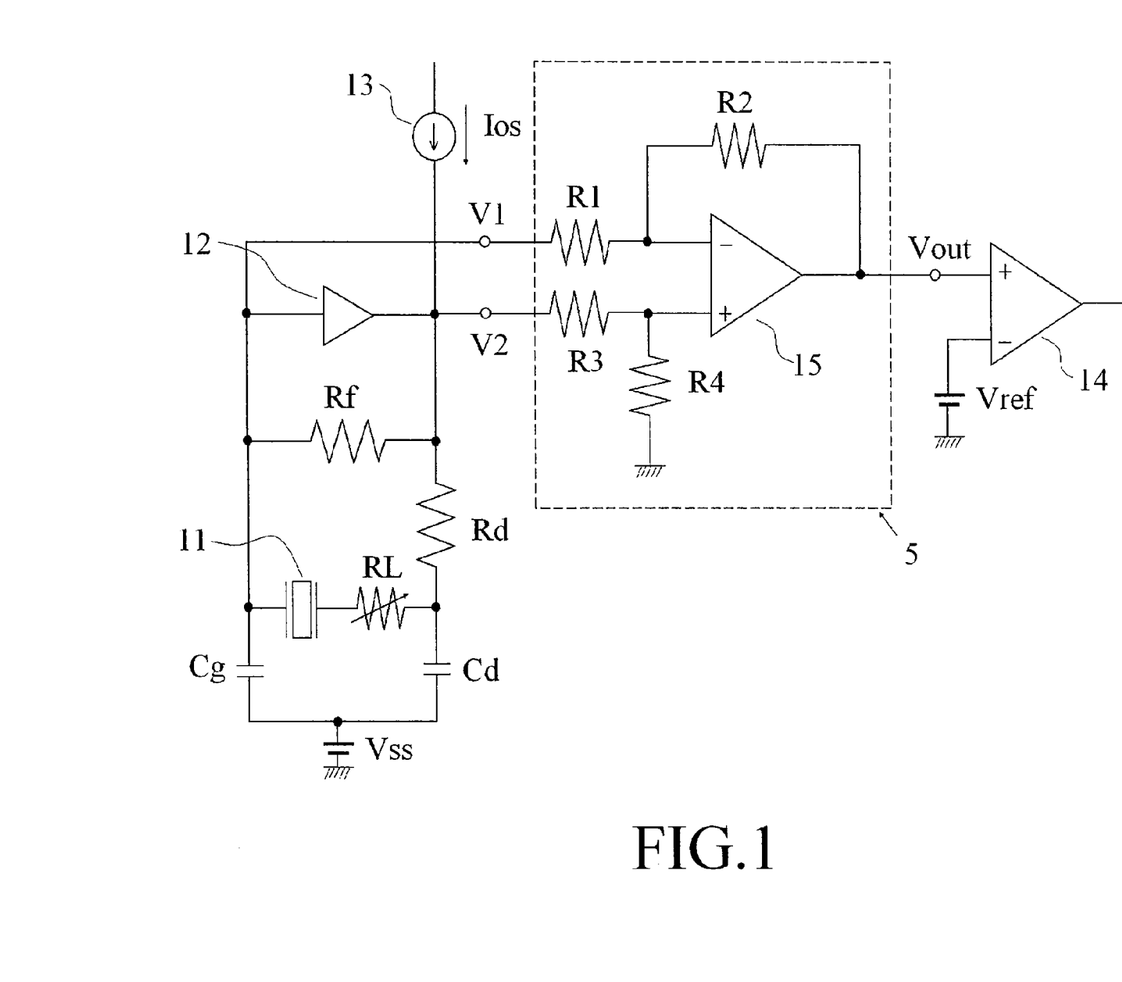
FIG. 1 shows an oscillator circuit including a differential amplifier circuit in accordance with the invention.

FIG. 1 shows an embodiment of the invention. A crystal oscillator circuit of the invention is provided with an amplifier circuit 5. The amplifier circuit 5 is an operational amplifier having four resistors (R1, R2, R3, R4), i.e., a differential amplifier. Accordingly, FIG. 1 shows a crystal oscillator circuit connected with a differential amplifier circuit. The crystal oscillator circuit is similar to the circuits shown in FIGS. 3 and 7. Although a comparator 14 is connected to the output side of the differential amplifier circuit 5, another device (e.g., an inverter) may be connected. In the crystal oscillator circuit connected with the differential amplifier circuit shown in FIG. 1, the input of the inverter of the crystal oscillator circuit (voltage V1) is input to the negative terminal of an operational amplifier 15 through a resistor R1, and the output of the crystal oscillator circuit (voltage V2), which is also the output of the inverter of the crystal oscillator circuit, is input to the positive terminal of the operational amplifier 15 through a resistor R3. Some of the output of the operational amplifier (differential amplifier) 15 is fed back to the negative terminal of the operational amplifier 15 through a resistor R2. On the other hand, the positive terminal of the operational amplifier 15 is grounded through a resistor R4.

Denoting the voltages of the input terminals of the operational amplifier 15 by Vin− (for the negative input terminal) and Vin+ (for the positive input terminal), Vin− and Vin+ are given by:

$$Vin-=(R2V1+R1V0)/(R1+R2)$$

and $$Vin+=R4V2/(R3+R4).$$

Applying virtual short Vin−=Vin+, the following holds:

$$R1V0/(R1+R2)=R4V2/(R3+R4)-R2V1/(R1+R2) \quad \text{Eq. (3).}$$

If R1=R3 and R2=R4, the output V0 of the operational amplifier (differential amplifier) 15 is given by:

$$V0=(R2/R1)*(V1-V2) \quad \text{Eq. (4),}$$

thus, the differential amplifier 15 operates as a circuit that amplifies the difference between V1 and V2.

In addition, if R2=R1, V0=V1−V2 holds, meaning that the differential amplifier can provide the difference between the output of the crystal oscillator circuit and the input of the inverter of the crystal oscillator circuit (i.e., |V1−V2|). Since V2 can be considered to be equal to −V1, the differential amplifier circuit can provide output that is twice as large as the output V2 of the stand-alone crystal oscillator circuit. On the other hand, if R2≠R1, appropriately setting the ratio of resistors connected to the operational amplifier 15 (R2/R1) to be larger than 1 further allows the amplification with a gain of R2/R1. In this case, the differential amplifier can provide output that is 2*(R2/R1) times as large as the output V2 of the stand-alone crystal oscillator circuit.

The output of the amplifier circuit is analog signal in synchronization with the frequency of the crystal oscillator circuit. So, when connected to a conventional comparator or the like, the output of the amplifier circuit can be larger than the tolerance of the comparison voltage (operating voltage) of the comparator, allowing generation of a desired rectangular wave. Furthermore, since the differential amplifier detects the difference of two input voltages, only the difference of the two input voltages needs to be larger than a minimum detection voltage of the differential amplifier even when one of the two input voltages is smaller than the minimum detection voltage.

Figure 2:
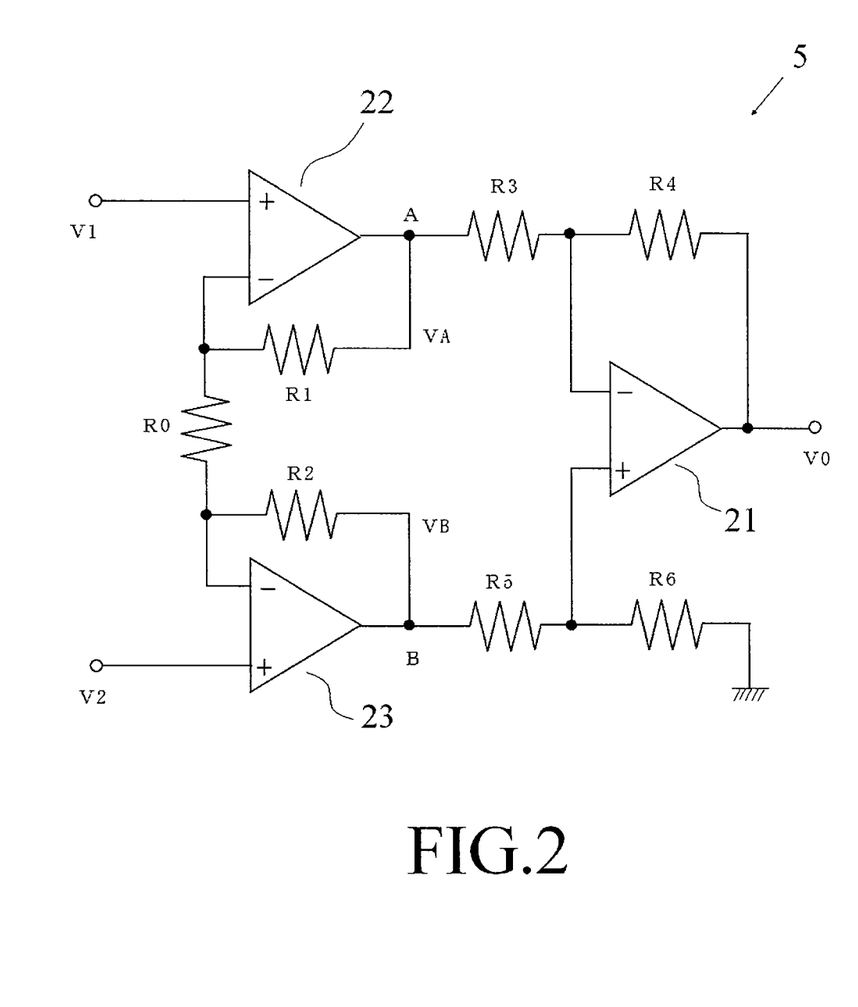
FIG. 2 shows an oscillator circuit including an instrumentation circuit in accordance with the invention.

FIG. 2 shows another embodiment of the invention. FIG. 2 shows only the block of the amplifier circuit 5 shown in FIG. 1. The amplifier circuit 5 is what is called an instrumentation amplifier circuit, including three operational amplifiers 21, 22 and 23 and seven resistors R0, R1, R2, R3, R4, R5 and R6. The operational amplifier 21 amplifies the voltage difference between terminals A and B. The terminals A and B are directly coupled with the output terminals of the operational amplifiers 22 and 23, so the terminals A and B are not affected by the input terminals (V1 and V2) in principle. If R3=R5 and R4=R6, the output voltage V0 is given by:

$$V0=(R4/R3)*(VB-VA) \quad \text{Eq. (5).}$$

Denoting the voltages of the negative input terminals of the operational amplifiers 22 and 23 by Vin−1 and Vin−2, respectively, Vin−1=V1 and Vin−2=V2 hold due to virtual short. As for the path from a point A through the resistors R1, R0 and R2 to a point B, the following holds:

$$(VA-V1)/R1=(V1-V2)/R0=(V2-VB)/R2.$$

Therefore, $$(VA-V1)=(R1/R0)*(V1-V2) \quad \text{Eq. (6)}$$

and $$(V2-VB)=(R2/R0)*(V1-V2) \quad \text{Eq. (7).}$$

Adding Eqs. (6) and (7) together:

$$VA-VB-(V1-V2)=(R1+R2/R0)*(V1-V2).$$

Therefore, $$VA-VB=\{1+(R1+R2)/R0\}*(V1-V2) \quad \text{Eq. (8).}$$

Then, the following is derived from Eqs. (5) and (8):

$$V0=(R4/R3)*\{1+(R1+R2)/R0\}*(V2-V1) \quad \text{Eq. (9).}$$

If R1=R2, this amplifier circuit has complete symmetry.

As seen from Eq. (9), with this instrumentation amplifier, the difference between the output voltage of the oscillator circuit and the input voltage of the inverter can be amplified with a gain of (R4/R3){1+(R1+R2)/R0}, where (R4/R3){1+(R1+R2)/R0}≥1. If all the resistors have the same resistance, Eq. (9) becomes V0=3*(V2−V1), providing a gain of 3. Since V1≈−V2, Eq. (9) becomes V0=6*V2, providing output that is 6 times as large as the output V2 of the stand-alone crystal oscillator circuit.

An advantage of this circuit is that both inputs are directly coupled with operational amplifiers having high input resistance, which is suitable for weak output signal from an oscillator circuit and useful for an ultra-low power consumption type reduced-CL oscillator circuit. Furthermore, varying only one resistor (R0) can vary the gain over a wide range.

Denoting the operational voltage limit of an operational amplifier by Vd, the detection limit of the differential amplifier of the amplifier circuit of the invention is 0.5 Vd. So it should be noted that when the output Vs of the crystal oscillator circuit is less than 0.5 Vd, the amplifier circuit of the invention also does not operate properly. In the foregoing, the oscillator circuit including the crystal resonator has been generally described. However, the oscillator circuit including the amplifier circuit of the invention is also applicable to a case of using another piezoelectric resonator (e.g., a ceramic resonator) rather than a crystal resonator. The oscillator circuit including the amplifier circuit of the invention described above can be included and used in any oscillator circuit used for an oscillator or electronic apparatus including a crystal resonator or another piezoelectric resonator. For example, the electronic apparatus may be a battery-driven electronic apparatus, such as a watch, mobile phone, personal digital assistant, notebook computer and the like. Furthermore, the invention is applicable to a wide range of electronic apparatuses required for energy saving or power saving, such as in-car electronic apparatuses and home-use products including a television-set, refrigerator and air-conditioner.

What is claimed is:
1. An oscillator circuit comprising:
a crystal resonator circuit including a CMOS inverter and a first output and a second output; and
an amplifier circuit, wherein the amplifier circuit comprises a differential amplifier circuit including a differential amplifier that amplifies a difference between a first output voltage of the crystal resonator circuit and an output voltage of the CMOS inverter, and the CMOS inverter outputs an inverted voltage of the first voltage to the amplifier circuit from a single input voltage, wherein the first output of the crystal resonator circuit and an input of the CMOS inverter are connected to a negative input terminal of the differential amplifier through a resistor R1, and the second output of the crystal resonator circuit is connected to a positive input terminal of the differential amplifier through a resistor R3, and wherein some of an output voltage of the differential amplifier is fed back to the negative input terminal through a resistor R2, and the positive input terminal of the differential amplifier is grounded through a resistor R4.

2. The oscillator circuit according to claim 1, wherein a resistance value of resistor R1 and a resistance value of R2 have the ratio R2/R1≥1.

3. An electronic apparatus including the oscillator circuit according to claim 1.

4. An oscillator circuit comprising:
   a crystal resonator circuit including a CMOS inverter; and
   an amplifier circuit that amplifies a difference between an output voltage of the resonator circuit and a single input voltage of the CMOS inverter, wherein the CMOS inverter outputs an inverted voltage of the input voltage to the amplifier circuit,
   wherein the amplifier circuit comprises an instrumentation amplifier comprising three operational amplifiers, and
   wherein the output of the crystal resonator circuit and the input of the CMOS inverter are connected to inputs of the instrumentation amplifier.

5. An electronic apparatus including the oscillator circuit according to claim 4.

* * * * *